United States Patent
Tran et al.

(10) Patent No.: US 6,813,194 B2
(45) Date of Patent: Nov. 2, 2004

(54) BIAS DISTRIBUTION NETWORK FOR DIGITAL MULTILEVEL NONVOLATILE FLASH MEMORY

(75) Inventors: Hieu Van Tran, San Jose, CA (US); William John Saiki, Mountain View, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 153 days.

(21) Appl. No.: 10/044,821

(22) Filed: Jan. 10, 2002

(65) Prior Publication Data

US 2003/0128594 A1 Jul. 10, 2003

(51) Int. Cl.$^7$ .............................................. G11C 16/06
(52) U.S. Cl. ......................... 365/189.09; 365/185.21; 365/185.18; 327/530
(58) Field of Search ....................... 365/185.21, 185.11, 365/185.18, 189.09, 226; 327/530, 538, 543

(56) References Cited

U.S. PATENT DOCUMENTS

| | | | | |
|---|---|---|---|---|
| 6,134,141 A | * | 10/2000 | Wong | 365/185.03 |
| 6,282,145 B1 | * | 8/2001 | Tran et al. | 365/230.06 |
| 6,396,757 B1 | * | 5/2002 | Quader et al. | 365/208 |
| 6,606,265 B2 | * | 8/2003 | Bergemont et al. | 365/185.01 |
| 2002/0196664 A1 | * | 12/2002 | Pascotti et al. | 365/185.21 |

* cited by examiner

*Primary Examiner*—Van Thu Nguyen
*Assistant Examiner*—Toan Le
(74) *Attorney, Agent, or Firm*—Gray Cary Ware & Freidenrich LLP

(57) ABSTRACT

A memory device includes an array of memory cells arranged in rows and columns with a portion of the rows of the memory cells being divided into segments. A global bias circuit generates a plurality of first bias currents. Each of a plurality of local bias networks includes a local bias circuit that generates a plurality of second bias currents in response to a corresponding one of the plurality of first bias currents, and includes a plurality of segment bias circuits that each generates a third bias current. Each segment bias circuit is adjacent to a corresponding segment of the memory cells. Each segment bias circuit provides a ground feedback signal to the local bias circuit, which adjusts the second bias current in response to the ground feedback signal. The segment bias circuits are disposed in geometric positions in the segments.

37 Claims, 5 Drawing Sheets

US 6,813,194 B2

BIAS DISTRIBUTION NETWORK FOR DIGITAL MULTILEVEL NONVOLATILE FLASH MEMORY

BACKGROUND OF THE INVENTION

The present invention relates to a bias distribution network, and more particularly to a bias distribution network for a memory.

Mixed mode non-volatile memory integrated circuit systems typically use bias across wide dimensions on a chip. Bias levels typically varies across the chip, because of physical boundary, power supply and temperature variation, or across multiple lots. However, a level bias across the chip is desired to ensure consistent performance for each memory cell, such as during programming or reading. For multilevel flash memory, the desire for a level bias is even more severe due to smaller margin per voltage level.

SUMMARY OF THE INVENTION

The present invention provides a memory device that has bias levels that are more consistent across the device.

The present invention also provides a testing method and apparatus to monitor and force the bias level.

The present invention provides a memory device that comprises an array of memory cells arranged in rows and columns. A portion of the array of memory cells is divided into segments. A global bias circuit generates a plurality of first bias currents. A plurality of local bias networks each comprise a local bias circuit that generates a plurality of second bias currents in response to a corresponding one of the plurality of first bias currents, and each comprises a plurality of segment bias circuits generating a third bias current. Each segment bias circuit is adjacent to a corresponding segment of said memory cells.

In one aspect, each segment bias circuit may provide a ground feedback signal to the local bias circuit, and in response thereto the local bias circuit adjusts the second bias current.

In one aspect, the segment bias circuits may be disposed in geometric positions in the segments.

In one aspect, the global bias circuit may include a global trim circuit to adjust the plurality of first bias currents in response to a global trim signal. Each local bias network may include a local trim circuit to adjust the plurality of second bias currents in response to a local trim signal.

BRIEF DESCRIPTION OF THE DRAWINGS

FIG. 2a is a block diagram illustrating a multilevel flash memory system comprising a distributed current network with ground feedback according to the present invention.

FIG. 2b is a graph illustrating the distribution of current along the distributed current network of FIG. 2a.

FIG. 3 is a schematic diagram illustrating a local bias current circuit of the distributed current network of FIG. 2a.

FIG. 4 is a schematic diagram illustrating a global bias network of the distributed current network of FIG. 2a.

DETAILED DESCRIPTION

As used herein, an NX NMOS transistor is a native device having a gate threshold voltage approximately equal to zero (Vt=~0 V). An NH NMOS transistor is an enhancement device having a gate threshold approximately in the range of 0.4–1.0 volts.

Figure 1:
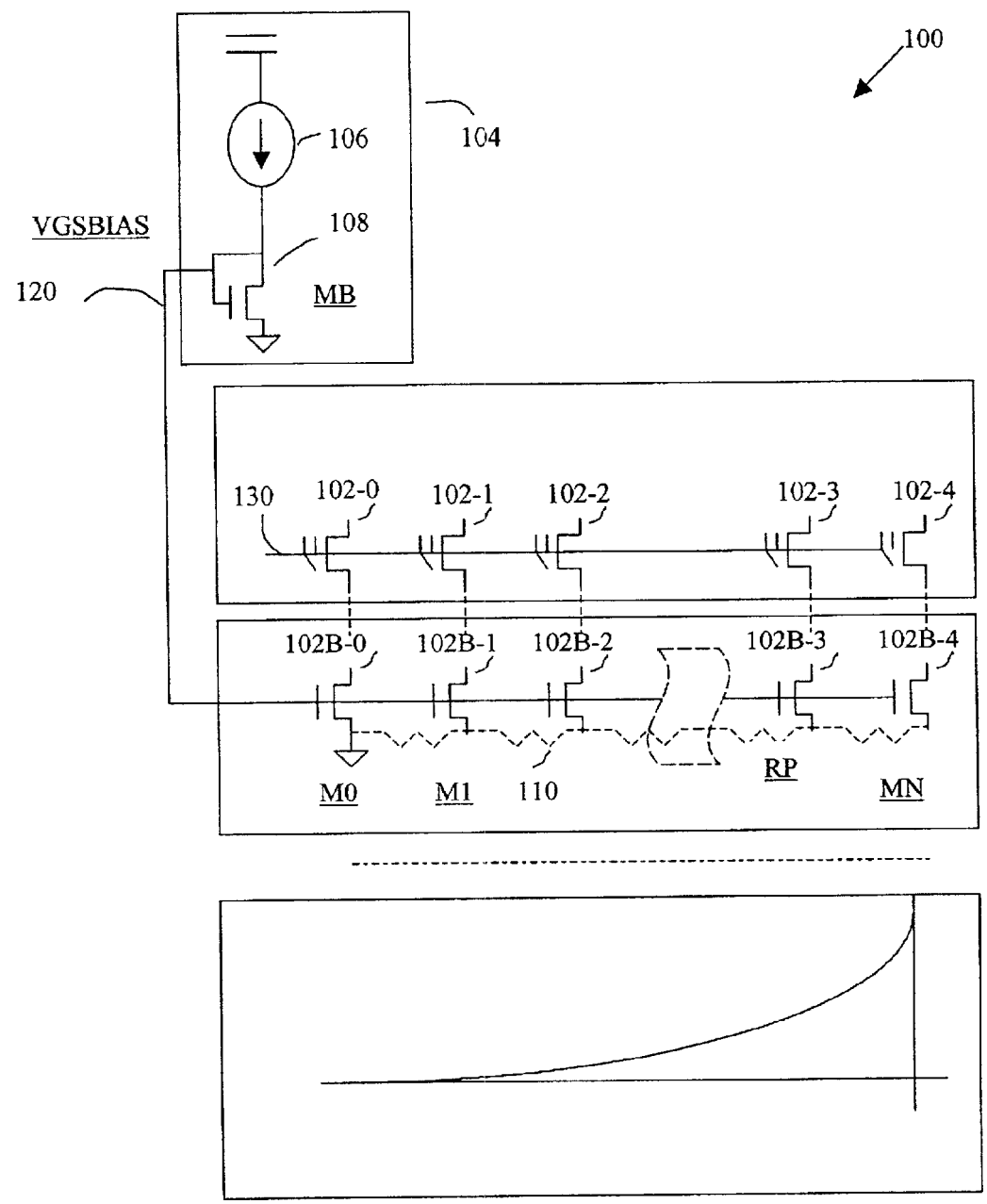
FIG. 1 is a block diagram illustrating a multilevel flash memory system with current bias and a graph illustrating the distribution of the current bias along a row of the multilevel flash memory system.

FIG. 1 is a block diagram illustrating a multilevel flash memory system with current bias and a graph illustrating the distribution of current bias along a row of the multilevel flash memory system. The multilevel flash memory system 100 comprises a plurality of memory cells 102-0 through 102-N, a plurality of bias transistors 102B-0 through 102B-N, and a current bias source 104. The bias transistors 102B-0 through 102B-N are coupled to the memory cells 102-0 through 102-N respectively. In one embodiment, the plurality of memory cells 102-0 through 102-N are arranged as an array of rows and columns. For ease of illustration, only one row of memory cells 102 is shown. A word line 130 couples a row of memory cells 102. In one embodiment, the plurality of memory cells 102-0 through 102-N are source side hot electron injection flash memory. In one embodiment, the plurality of memory cells 102-0 through 102-N are split gate memory cells. The current bias source 104 is coupled to the plurality of memory cells 102-0 through 102-N for providing a current bias to the memory cells 102. In one embodiment, the current bias source 104 functions as a current mirror in conjunction with the memory cells 102. The current bias source 104 comprises a current source 106 and an NMOS transistor 108.

The current bias source 106 generates a current bias that is used, for example, to program multiple memory cells 102 along a single row or to read multiple memory cells 106 along a single row.

The current source 106 and the transistor 108 generate a current IBIAS to generate bias voltage (VGSBIAS) 120. The bias voltage (VGSBIAS) 120 is applied to gates of the transistors of the memory cells 102-0 through 102-N to create bias current in the transistors thereof. The voltage drop along a ground line 110, which is coupled to sources of the transistors of the memory cells 102-0 through 102-N, is shown from left to right in the lower portion of FIG. 1. Due to the resistive nature of the interconnect line (shown by parasitic resistance Rp) and the current bias along the ground line 110, a geometric voltage drop exists from left to right. This voltage drop effectively causes the VGS to drop from left to right for the bias transistors 102B-0 through 102B-N. That causes an unintended consequence of current bias variation across the memory cells 102, as shown on FIG. 1 from left to right. Because the ground line of the transistor 108 may be different from the ground line of the bias transistors 102B-0 through 102B-N due to their different physical locations on the chip, unpredictable voltage differences exist between the two ground lines which causes further bias variation.

Figures 2A, 2B:
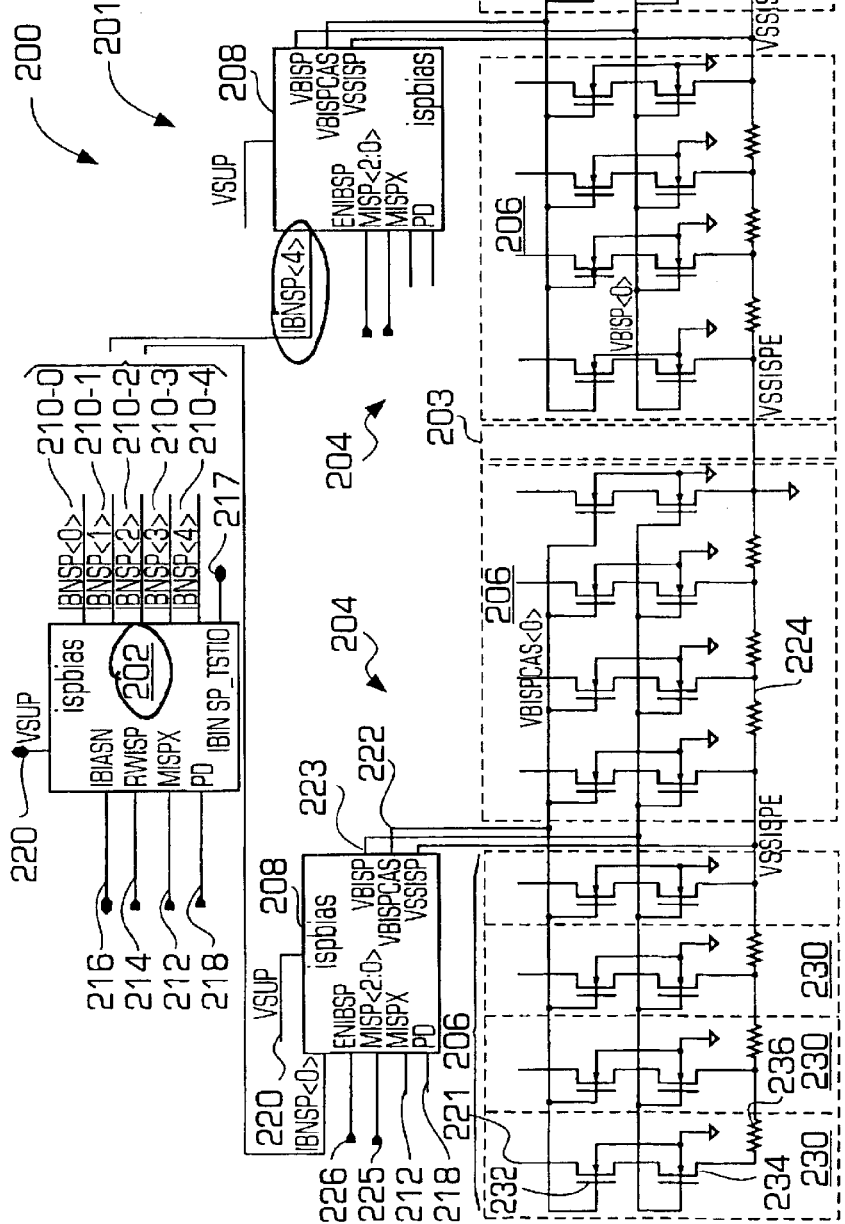

FIG. 2a is a block diagram illustrating a multilevel flash memory system 200 that includes a distributed current network 201 with ground feedback according to the present invention. FIG. 2b is a graph illustrating the distribution of current along the distributed current network 201. The distributed current network 201 comprises a global bias network 202, and a plurality of local bias networks 204. The local bias networks 204 each comprise a plurality of segment circuits 206 and a local bias current circuit 208. The distributed current network 201 according to the present invention described herein is suitable for a mixed mode multilevel flash high density system such as described in patent U.S. Pat. No. 6,282,145 by H. Tran et al., assigned to the same assignee, the subject matter of which is incorporated herein by reference.

The global bias network 202 generates a plurality of local bias currents (IBNSP) 210-0 through 210-4. For the sake of illustration, only five bias currents (IBNSP) 210-0 through 210-4 are shown and only two local bias networks 204 are shown. However, the global bias network 202 may generate more or less bias currents 210, and may include more local bias networks 204.

A global trim (MISPX) signal 212 is applied to the global bias network 202 to select trim circuits (see FIG. 3) therein for adjusting the bias current. A read/write bias current control (RWISP) signal 214 enables the monitoring or adjusting of a bias current (IBIASN) 216 applied to the global bias network 202. An I/O bias current (IBIN SP_TSTIO) signal 217 receives a monitor current for reading or provides a forcing current for writing. A power down (PD) signal 218 is applied to the global bias network 202 and the local bias network 204 to disable the biasing applied thereto during power down. A supply voltage (VSUP) 220 provides power to the global bias network 202 and the local bias network 204.

The local bias network 204 provides a first bias voltage (VBISPCAS) 222 and a second bias voltage (VBISP) 223 for the segment circuits 206 and memory cells 203 of the memory 200. A feedback ground line (VSSISP) 224 provides feedback of the ground from the segment circuits 206 to the local bias current circuit 208. A corresponding one of the local bias currents (IBNSP) 210-0 through 210-4 is applied to the local bias current circuit 208. The global trim (MISPX) signal 212 is applied to the local bias current circuit 208 to adjust the bias current. A local trim (MISP<2:0>) signal 225 is applied to the local bias current circuit 208 to provide a programmable adjustment of the bias current. In response to a bias voltage output enable (ENIBSP) signal 226, the local bias current circuit 208 provides the first bias voltage (VBISPCAS) 222 and the second bias voltage (VBISP) 223.

The segment circuit 206 comprises a plurality of segment bias circuits 230. The segment bias circuit 230 comprises a pair of NMOS transistors 232, 234, and a resistor 236. (For clarity, the segment bias circuits 230 are labeled for only one segment circuit 206, and the transistors 232, 23 and the resistor 236 are labeled for only one segment bias circuit 230.) The pair of NMOS transistors 232, 234 are coupled together in a cascode arrangement between a terminal 221 and a first terminal of the resistor 236. A second terminal of the resistor 236 is coupled to the first terminal of the resistor 236 in the next segment bias circuit 230, except the second terminal of the resistor 236 in the last segment bias circuit 230 is coupled to the feedback ground line (VSSISP) 224. The first bias voltage (VBISPCAS) 222 is applied to the gate of the NMOS transistor 232. The second bias voltage (VBISP) 223 is applied to the gate of the NMOS transistor 234.

The memory system 200 comprises a plurality of memory cells 203 arranged in rows and columns. (For clarity only one memory cell 203 is shown in FIG. 2a). The local bias networks are disposed adjacent sections of memory cells 203 with the segment circuits 206 disposed adjacent portions of a row of memory cells 203 to partition the row into segments of memory cells 203 that are biased by a corresponding segment circuit 206. The positioning of the segment circuits 206 divide the segment so that the voltage drop along the feedback ground line (VSSISP) 224 is divided into multiple voltage segments. Each local bias network 204 has its bias ground fed from the feedback ground line (VSSISP) 224 of the segment circuits 206. By feeding back the feedback ground line (VSSISP) 224 from the segment circuit 206 into the local bias network 204, the relative bias voltage (VGS) is maintained between the transistors in the local bias network 204 and the bias segment circuits 206.

In one embodiment, the segment circuits 206 are positioned at a predetermined position along a bias segment, for example, by geometric positioning, such as at approximately ¼ of the segment length away from highest voltage drop along the bias segment, to make the voltage difference between the left and right bias segment to the bias network approximately the same.

In another embodiment, the local bias networks 204 may be positioned along the bias segment to divide the whole voltage difference into equal voltages for each segment.

In another embodiment, each segment ground line may be coupled together, such as a metal connection for an integrated circuit, to a main ground line to make the voltage difference along the ground line for each segment the same. In another embodiment, all the bias lines for all segments (VGSBIAS) could be connected together.

Figure 3:
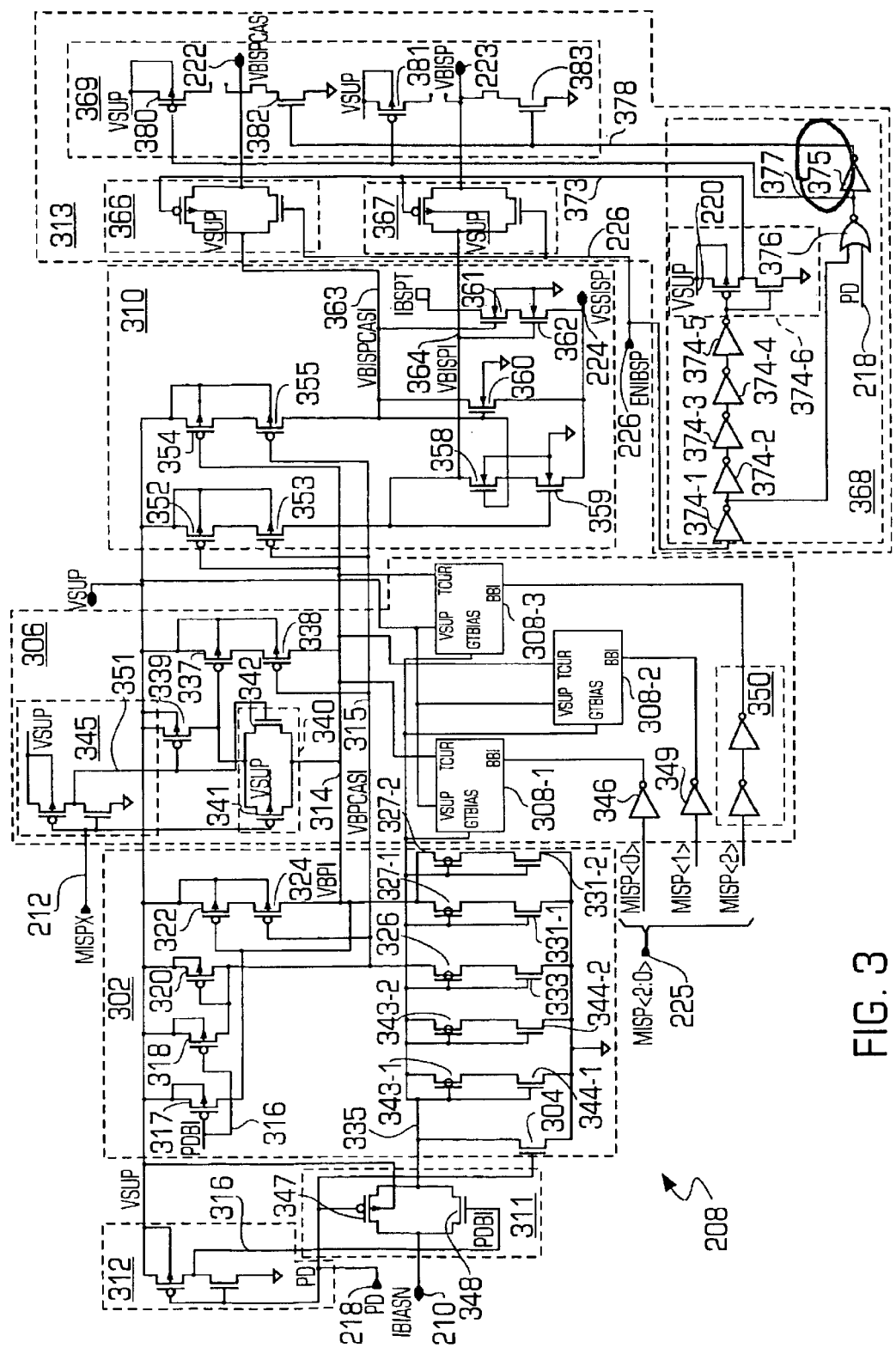

FIG. 3 is a schematic diagram illustrating the local bias current circuit 208 according to the present invention.

The local bias current circuit 208 comprises a bias control circuit 302, an NH NMOS transistor 304, a trim circuit 306, bias circuit 310, a transfer gate 311, an inverter 312, and an output circuit 313.

The bias control circuit 302 provides a gate bias voltage on a gate bias voltage (GTBIAS) line 335 for biasing the trim circuit 306, and provides a first internal bias voltage (VBPI) on a first internal bias voltage (VBPI) line 314 and a second internal bias voltage (VBPCASI) on a second internal bias voltage (VBPCASI) line 315 for biasing the bias circuit 310.

The transfer gate 311 controls the application of the local bias current 210 to the gate bias voltage (GTBIAS) line 335. The transfer gate 311 comprises a PMOS transistor 347 and an NH NMOS transistor 348 including drain and source terminals coupled to the respective drain and source terminal of the other. A low level of the power down (PD) signal 218 applied to the gate of the PMOS transistor 347, and a corresponding high level of an inverted power down signal 316 from the inverter 312 applied to the gate of the NMOS transistor 348 enables the transfer gate 311 to couple the local bias current 210 to the gate bias voltage (GTBIAS) line 335.

The NH NMOS transistor 304 includes drain-source terminals coupled between the gate bias voltage (GT BIAS) line 335 and a ground terminal to ground the line 335 in response to the power down (PD) signal 218 applied to the gate of the NH NMOS transistor 304.

The bias control circuit 302 comprises a plurality of PMOS transistors 317, 318, 320, 322, 324, a plurality of NX NMOS transistors 326, 327-1, 327-2, 343-1, 343-2, and a plurality of NH NMOS transistors 331-1, 331-2, 333, 344-1, 344-2.

The PMOS transistor 320, the NX NMOS transistor 326, and the NH NMOS transistors 333 provide a bias voltage to the second internal bias voltage (VBPCASI) line 315, which is coupled to the bias circuit 310. The PMOS transistor 320 includes a source terminal coupled to the supply voltage (VSUP) 220 and is diode connected with its gate coupled to its drain and also coupled to the second internal bias voltage (VBPCASI) line 315. The NX NMOS transistor 326 includes a drain terminal coupled to the drain terminal of the PMOS transistor 320, and includes the gate coupled to the gate bias voltage (GTBIAS) line 335. The NH NMOS transistor 333 includes drain-source terminals coupled between the source of the NX NMOS transistor 326 and ground, and includes a gate coupled to the gate bias voltage (GTBIAS) line 335. The PMOS transistor 318 provides additional current to the second internal bias voltage (VBPCASI) line 314. The PMOS transistor 318 includes drain-source terminals coupled between the supply voltage (VSUP) 220 and the common node formed of the gate and drain of the PMOS transistor 320, and includes a gate controlled by the inverted power down signal 316 from the inverter 312.

The cascode NX NMOS transistors 343 and the NH NMOS transistors 344 provide bias current. The NX NMOS transistors 343 and the NH NMOS transistors 344 include drain-source terminals coupled in series between the gate bias voltage (GTBIAS) line 335 and ground, and include gates coupled together and to the gate bias voltage (GTBIAS) line 335. Two transistors 343-1 and 343-2 and two transistors 344-1 and 344-2 are shown; however other numbers of transistors 343 and 344 may be included to adjust the biasing.

The PMOS transistors 322, 324 the NX NMOS transistors 327-1, 327-2, and the NH NMOS transistors 331-1, 331-2 provide a bias voltage to the first internal bias voltage (VBPI) line 314, which is coupled to the bias circuit 310. The PMOS transistor 322 includes a source terminal coupled to the supply voltage (VSUP) 220. The PMOS transistor 324 includes a source coupled to the drain of the PMOS transistor 322 and includes a drain coupled to the first internal bias voltage (VBPI) line 314. The gate of the PMOS transistor 322 is coupled to the first internal bias voltage (VBPI) line 314. The gate of the PMOS transistor 324 is coupled to the second internal bias voltage (VBPCASI) 315. The NX NMOS transistor 327-1 includes a drain terminal coupled to the drain terminal of the PMOS transistor 324, and includes a gate coupled to the gate bias voltage (GTBIAS) line 335. The NH NMOS transistor 331-1 includes drain-source terminals coupled between the source of the NX NMOS transistor 327-1 and ground, and includes a gate coupled to the gate bias voltage (GTBIAS) line 335. The NX NMOS transistor 327-2 and the NH NMOS transistor 331-2 are arranged in a manner similar to the NX NMOS transistor 327-1 and NH NMOS transistor 331-1. Two transistors 327-1 and 327-2 and two transistors 331-1 and 331-2 are shown; however other numbers of transistors 327 and 327 may be used to adjust the biasing. The PMOS transistor 317 provides additional bias to the first internal bias voltage (VBPI) line 314. The PMOS transistor 317 includes drain-source terminals coupled between the supply voltage (VSUP) 220 and the gate of the PMOS transistor 322, and includes a gate controlled by the inverted power down signal 316 from the inverter 312.

The trim circuit 306 comprises trim circuits 308-1 through 308-3, PMOS transistors 337, 338, 339, a transfer gate 340, inverters 345, 346, 349 and an inverter pair 350. The PMOS transistors 337, 339 provide selectable biasing for the first internal bias voltage (VBPI) 314. The PMOS transistor 337 includes a source coupled to the supply voltage (VSUP) 220, includes a drain coupled to a source of the PMOS transistor 338, and includes a gate coupled via the transfer gate 340 to the first internal bias voltage (VBPI) 314. The PMOS transistor 338 includes a drain terminal coupled to the first internal bias voltage (VBPI) 314 and includes a gate coupled to the second internal bias voltage (VBPCASI) line 315.

The PMOS transistor 339 provides selectable bias for the PMOS transistor 337. The PMOS transistor 339 includes drain-source terminals coupled between the supply voltage (VSUP) 220 and the common node formed of the transfer gate 340 and the gate of the PMOS transistor 337, and includes a gate coupled to an inverted global trim (MISPXB) signal 351, generated by the inverter 345 in response to the global trim signal (MISPX) 212. The transfer gate 340 couples the gate of the PMOS transistor 337 to the first internal bias voltage (VBPI) 314 in response to a low state of the global trim (MISPXB) signal 352. The transfer gate 340 comprises a PMOS transistor 341 and an NH NMOS transistor 342. The PMOS transistor 341 includes source and drain terminals coupled to respective drain and source terminals of the NH NMOS transistor 342 and to the respective drain of the PMOS transistor 339 and the first internal bias voltage (VBPI) 314. The gates of the PMOS transistor 341 and the NMOS transistor 342 are coupled to the global trim signal (MISPX) 212 and the inverted global trim signal (MISPXB) 351, respectively.

The trim circuits 308 provide additional trim current on the gate bias voltage line (VBPI) 314. The trim circuits 308 are biased by the bias voltage line (GTBIAS) 335. The trim circuits 308-1, 308-2, 308-3 are selected by the local trim (MISP<0:2>) signals 225, respectively. The inverter 346, the inverter 349, and the inverter pair 350 apply trim enable signals to the trim circuits 308-1, 308-2, and 308-3, respectively, in response to the local trim signals 225. The trim circuit 308 is described below in conjunction with FIG. 5.

The bias circuit 310 comprises PMOS transistors 352, 353, 354, 355 and NH NMOS transistors 358, 359, 360, 361, and 362. The bias circuit 310 generates a third internal bias voltage (VBISPCASI) 363 and a fourth internal bias voltage (VBISPI) 364.

The PMOS transistors 352 and 353 include drain-source terminals coupled in series between the supply voltage (VSUP) 220 and the fourth internal bias voltage (VBISPI) 364. The gates of the PMOS transistors 352 and 353 are biased by the first internal bias voltage (VBPI) 314 and the second internal bias voltage (VBPCASI) 315, respectively. The NH NMOS transistors 358 and 359 include drain-source terminals coupled in series between the fourth internal bias voltage (VBISPI) 364 and the feedback ground line (VSSISP) 224. The substrates of the NH NMOS transistors 358, 359 are coupled to ground. In another embodiment, the substrates of the NH NMOS transistors 358, 359 are coupled to the feedback ground line (VSSISP) 224. This eliminates local body effect with a local substrate potential that is non-zero. The gates of the NH NMOS transistors 358 and 359 are biased by the third internal bias voltage (VBISPCASI) 363 and the fourth internal bias voltage (VBISPI) 364, respectively. In one embodiment, the NH NMOS transistor 359 is barely saturated.

The PMOS transistors 354 and 355 include drain-source terminals coupled in series between the supply voltage (VSUP) 220 and the third internal bias voltage (VBISPCASI) 363. The gates of the PMOS transistors 354 and 355 are biased by the first internal bias voltage (VBPI) 314 and the second internal bias voltage (VBPCASI) 315, respectively. The NH NMOS transistor 360 includes drain-source terminals coupled between the third internal bias voltage (VBISPCASI) 363 and the feedback ground line (VSSISP) 224, and includes a gate biased by the third internal bias voltage (VBISPCASI) 363. The substrate of the NMOS transistor 360 is coupled to ground. In another embodiment, the substrate of the NH NMOS transistor 360 is coupled to the feedback ground line (VSSISP) 224. This eliminates local body effect with a local substrate potential that is non-zero.

The NH NMOS transistors 361 and 362 provide a bias level in response to a bias test signal applied to a bias test point (IBSPT) 356. The NH NMOS transistors 361 and 362 include drain-source terminals coupled in series between the bias test point (IBSPT) 356 and the feedback ground line (VSSISP) 224. The substrates of the NH NMOS transistors 361 and 362 are coupled to ground. The gates of the NH NMOS transistors 361 and 362 are biased by the third internal bias voltage (VBISPCASI) 363 and the fourth internal bias voltage (VBISPI) 364, respectively.

The output circuit 313 disconnects the bias voltages without turning off the bias control circuit 302 or the bias circuit 310. The output circuit 313 comprises transfer gates 366, 367, a clock circuit 368, and a signal state control circuit 369.

The transfer gates 366 and 367 couple the third internal bias voltage (VBISPCASI) 363 and the fourth internal bias voltage (VBISPI) 364 to the first bias voltage (VBISPCAS) 222 and the second bias voltage (VBISP) 223, respectively, in response to a high level of the bias voltage output enable (ENIBSP) signal 226 or a low level of a delayed bias voltage output enable signal 373 from the clock circuit 368.

The clock circuit 368 provides the delayed bias voltage output enable signal 373, which is a delayed signal of the bias voltage output enable (ENIBSP) signal 226. The clock circuit 368 comprises a plurality of inverters 374-1 through 374-6, an inverter 375, and a NOR gate 376. The inverters 374-1 through 374-6 are coupled together in series to generate the delayed bias voltage output enable signal 373 in response to the bias voltage output enable (ENIBSP) signal 226 applied to the inverter 374-1. The clock circuit 368 provides non-overlapping timing signals to cause a break before make connection of the output circuit 313. The inverter 374-6 has its power supply from the supply voltage (VSUP) 220 while the inverters 374-1 to 374-5 may have their power supply from another supply voltage. This scheme ensures internal control signals (output enable signal 373) are isolated from other noisy supply voltages.

The NOR gate 376 generates an output disable signal 377 and the inverter 375 generates an inverted output disable signal 378 to cause the signal state control circuit 369 to either ground the first bias voltage (VBISPCAS) 222 and the second bias voltage (VBISP) 223 or set the voltages 222 and 223 to the supply voltage (VSUP) 220. In the event that either the power down signal 318 is high or the bias voltage output enable (ENIBSP) signal 226 is low, the signal state control circuit 369 is activated.

The signal state control circuit 369 comprises PMOS transistors 380 and 381 and NH NMOS transistors 382 and 383. In one embodiment, the NH NMOS transistors 382 and 383 are used, and the PMOS transistors 390 and 381 are not used or are not included. In this embodiment, the NH NMOS transistors 382 and 392 includes drain-source terminals coupled between the respective first bias voltage (VBISPCAS) line 222 and second bias voltage (VBISP) line 223 and the ground terminal to ground the lines 222 and 223 in response to a high level of the inverted output disable signal 378 applied to the gates of the NH NMOS transistors 382 and 383. In another embodiment, the PMOS transistors 380 and 381 are used, and the NH NMOS transistors 382 and 383 are not used or not included. In this embodiment, the PMOS transistors 380 and 381 include drain-source terminals coupled between the respective first bias voltage (VBISPCAS) line 222 and second bias voltage (VBISP) line 223 and the supply voltage (VSUP) 220 to pull up the lines 222 and 223 in response to a low level of the output disable signal 377 applied to the gates of the PMOS transistors 380 and 381.

The N channel bias structure of the bias control current 302, such as the NX NMOS transistor 343 and the NH NMOS transistor 344, uses self-cascoding with the native device on top. This structure eliminates one additional bias leg. The P channel bias structure, such as the PMOS transistors 324 and 322, uses self-cascoding, and includes an additional bias leg formed by the PMOS transistor 320. The N channel bias structure of the bias circuit 310 includes the NH NMOS transistors 358 and 359 use self cascoding, and includes an additional bias leg formed by the NH NMOS transistor 360. No native transistor is used. This structure maximizes headroom on the bias transistor in the bias segment, which is used in a manner similar to the memory cells 102-0 through 102-N of FIG. 1.

Figure 4:
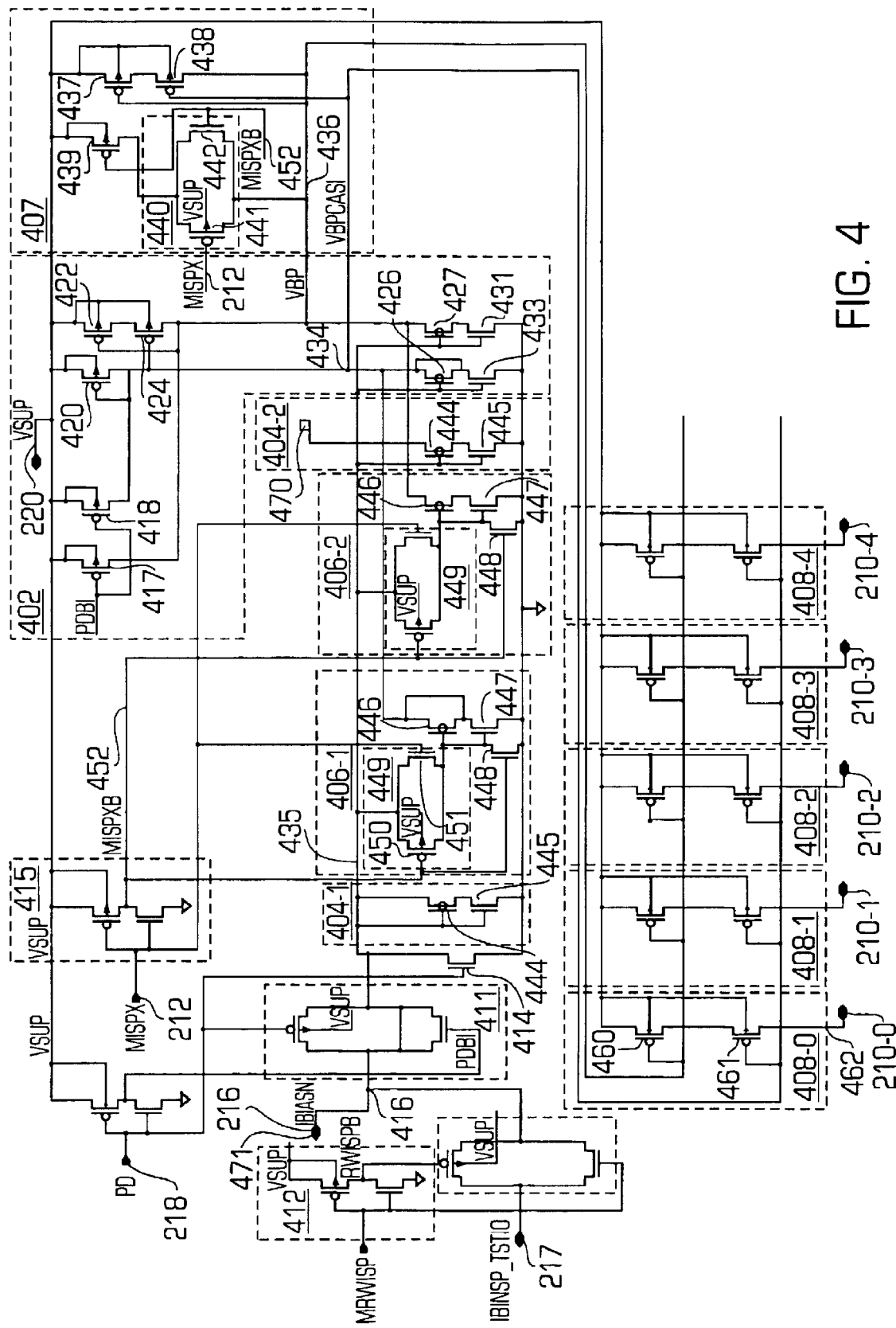

FIG. 4 is a schematic diagram illustrating the global bias network 202. The global bias network 202 comprises a bias control circuit 402, a plurality of current adjustment circuits 404-1, 404-2, a plurality of selectable current adjustment circuits 406-1, 406-2, a trim circuit 407, a plurality of bias current stages 408-0 through 408-4, transfer gates 410 and 411, and inverters 412, 413, 415 and an NMOS transistor 414.

The transfer gate 410 controls the coupling of the I/O bias current (IBIASN) 217 to a bias node 416. The transfer gate 410 is enabled by the read/write bias current control signal (RWISP) 214 and an inverted read/write bias current control signal (RWISPB) 465 from the inverter 412. The transfer gate 410 and the inverter 412 form a read/write current bias network for the bias current (IBIASN) 216, to allow operation of both a current read and a current write. In a read current mode, such as current monitoring, the read/write bias current control (RWISP) signal 214 is high to turn on the transfer gate 410 to pass the bias current (IBIASN) 216 to a test point 471 for the I/O bias current (IBINSP-TSTIO) 217. A load is then connected from the bias current 216 to a negative power supply and the current may be measured. In a write current mode, such as forcing current into the network, an external current from a power supply is applied to the test point 471 to add or subtract the external current to or from the bias current (IBIASN) 217.

The transfer gate 411 is controlled by the power down (PDI) signal 218 and an inverted power down signal from the inverter 413. A low level of the power down (PDI) signal 218 enables the transfer gate 411 to couple the bias current (IBIASN) 216 to an internal bias voltage (VBNIN) 435.

The NMOS transistor 414 includes drain-source terminals coupling the internal bias voltage (VBNIN) line 435 to ground in response to a high level of the power down (PDI) signal 218 applied to a gate thereof.

The bias control circuit 402 provides bias voltages to the plurality of bias current stages 408-1 through 408-5. The bias control circuit 402 comprises PMOS transistors 417, 418, 420, 422, 424, NX NMOS transistor 426, 427, and NH NMOS transistors 431, 433.

The PMOS transistor 420, the NX NMOS transistor 426, and the NH NMOS transistor 433 provide a bias voltage to a second bias voltage (VBPCASI) line 434, which is coupled to the bias current stages 408. The PMOS transistor 420 includes a source terminal coupled to the supply voltage (VSUP) 220 and is diode connected with its gate coupled to its (drain and also coupled to the second bias voltage (VBPCASI) line 434. The NX NMOS transistor 426 includes a drain terminal coupled to the drain terminal of the PMOS transistor 420, and includes a gate coupled to the internal bias voltage (VBNIN) line 435. The NH NMOS transistor 433 includes drain-source terminals coupled between the source of the NX NMOS transistor 426 and ground, and includes a gate coupled to the internal bias voltage (VBNIN) line 435. The PMOS transistor 418 provides additional current to the second bias voltage (VBPCASI) line 434 during power down. The PMOS transistor 418 includes drain-source terminals coupled between the supply voltage (VSUP) 220 and the common node formed of the gate and drain of the PMOS transistor 420, and includes a gate controlled by the inverted power down signal from the inverter 413.

The PMOS transistors 422, 424, the NX NMOS transistor 427, and the NH NMOS transistor 431 provide a bias current to a first bias voltage (VBPI) line 436, which is coupled to the bias current stages 408. The PMOS transistor 422 includes a source terminal coupled to the supply voltage (VSUP) 220, and includes a gate coupled to the first bias voltage (VBPI) line 436. The PMOS transistor 424 includes drain-source terminals coupled between the drain of the PMOS transistor 422, and the first bias voltage (VBPI) line 436, and includes a gate coupled to the common node of the drain of the PMOS transistor 420 and the second bias voltage (VBPCASI) line 434.

The NX NMOS transistor 427 includes a drain terminal coupled to the common node formed of the first bias voltage (VBPI) line 436 and the drain terminal of the PMOS transistor 424, and includes a gate coupled to the internal bias voltage (VBNIN) line 435. The NH NMOS transistor 431 includes drain-source terminals coupled between the source of the NMOS transistor 427 and ground, and includes a gate coupled to the internal bias voltage (VBNIN) line 435. The PMOS transistor 417 provides additional current to the first bias voltage (VBPI) line 436 during power down. The PMOS transistor 417 includes drain-source terminals coupled between the supply voltage (VSUP) 220 and the common node formed of the first bias voltage (VBPI) line 436 and the gate of the PMOS transistor 422, and includes a gate controlled by the inverted power down signal from the inverter 413.

The trim circuit 407 comprises PMOS transistors 437, 438, 439 and a transfer gate 440. The PMOS transistors 437 and 438 bias the first bias voltage (VPBI) line 436. The PMOS transistor 437 includes a source coupled to the supply voltage (VSUP) 220, includes a drain coupled to a source of the PMOS transistor 438, and includes a gate coupled to the first bias voltage (VBPI) line 436. The PMOS transistor 438 includes a drain terminal coupled to the first bias voltage (VPBI) line 436 and includes a gate coupled to the second bias voltage (VBPCASI) line 434.

The PMOS transistor 439 provides selectable bias for the first bias voltage (VPBI) line 436. The PMOS transistor 439 includes drain-source terminals coupled between the supply voltage (VSUP) 220 and the transfer gate 440, and includes a gate coupled to an inverted global trim (MISPXB) signal 452, generated by the inverter 415 in response to the global trim signal (MISPX) 212. The transfer gate 440 couples the PMOS transistor 439 to the first bias voltage (VPBI) line 436 in response to a low state of the global trim (MISPXB) signal 452. The transfer gate 440 comprises a PMOS transistor 441 and an NMOS transistor 442. The PMOS transistor 441 includes drain and source terminals coupled to respective drain and source terminals of the NMOS transistor 442 and to respective drain of the PMOS transistor 435 and the first bias voltage (VPBI) line 436. The gates of the PMOS transistor 441 and the NMOS transistor 442 are coupled to the global trim signal (MISPX) 212 and the inverted global trim signal (MISPXB) 452, respectively.

The current adjustment circuit 404 controls the bias on the internal bias voltage (VBNIN) line 435. A current adjustment circuit 404-1 comprises a NX NMOS transistor 444 and an NH NMOS transistor 445 that include drain-source terminals coupled in series between the internal bias voltage (VBNIN) line 435 and ground, and include gates coupled together and to the internal bias voltage (VBNIN) line 435. A current adjustment circuit 404-2 comprises an NX NMOS transistor 444 and an NH NMOS transistor 445 arranged in a manner similar to the current adjustment circuit 404-1 except the drain of the NX NMOS transistor 444 is coupled to a test point 470. An external current source may be coupled to the test point 470 or the test point 470 may be coupled to the internal bias voltage (VBNIN) line 435 to adjust the biasing of the current adjustment circuit 404.

The selectable current adjustment circuits 406-1 and 406-2 provide trimmable bias to the drive circuit portion of the bias control circuit 402 that drive the second bias voltage (VBPCASI) line 434 and the first bias voltage (VBPI) line 436, respectively. The selectable current adjustment circuits 406-1 comprises an NX NMOS transistor 446, NH NMOS transistors 447, 448, and a transfer gate 449. The NX NMOS transistor 446 and the NH NMOS transistor 447 include drain-source terminals coupled in series between the second bias voltage (VBPCASI) line 434 and ground, and in parallel to the NX NMOS transistor 426 and the NH NMOS transistor 433. The NMOS transistor 448 includes drain-source terminals coupled between the common node formed of the gates of the NX NMOS transistor 446 and the NH NMOS transistor 447 and ground, and includes a gate coupled to the inverted global trim (MISPX) signal 452. The NMOS transistors 448 turns off the NMOS transistors 446 and 447 in response to a high state of the global trim (MISPX) signal 212. The transfer gate 449 couples the common node formed of the gates of the NX NMOS transistor 446 and the NX NMOS transistor 447 to the internal bias voltage (VBNIN) line 435 in response to a high state of the global trim (MISPX) signal 212. The transfer gate 449 comprises a PMOS transistor 450 and an NH NMOS transistor 451.

The selectable current adjustment circuits 406-2 has an arrangement similar to the selectable current adjustment circuit 406-1. The selectable current adjustment circuit 406-2 comprises an NX NMOS transistor 446, NH NMOS transistors 447, 448, and a transfer gate 449. However, the drain of the NX NMOS transistor 446 is coupled to the first bias voltage (VBPI) line 436, instead of the second bias voltage (VBPCASI) line 434 as in the selectable current adjustment circuit 406-1.

The bias current stages 408-0 through 408-4 generate the respective local bias currents (IBNSP) 210-0 through 210-4. Each bias current stage 408 comprises PMOS transistors 460, 461. (For clarity, only the transistors of the bias current stage 408-0 are labeled with reference numbers.) The PMOS transistors 460, 461 are coupled in a cascode arrangement and include drain-source terminals coupled in series between the supply voltage 220 and an output terminal 462 of the bias current stage 408. The output terminal 462 provides the local bias current 210. The gate of the PMOS transistor 460 is biased first bias voltage (VBPI) 436. The gate of the PMOS transistor 461 is biased by the second bias voltage (VBPCASI) 434.

Figure 5:
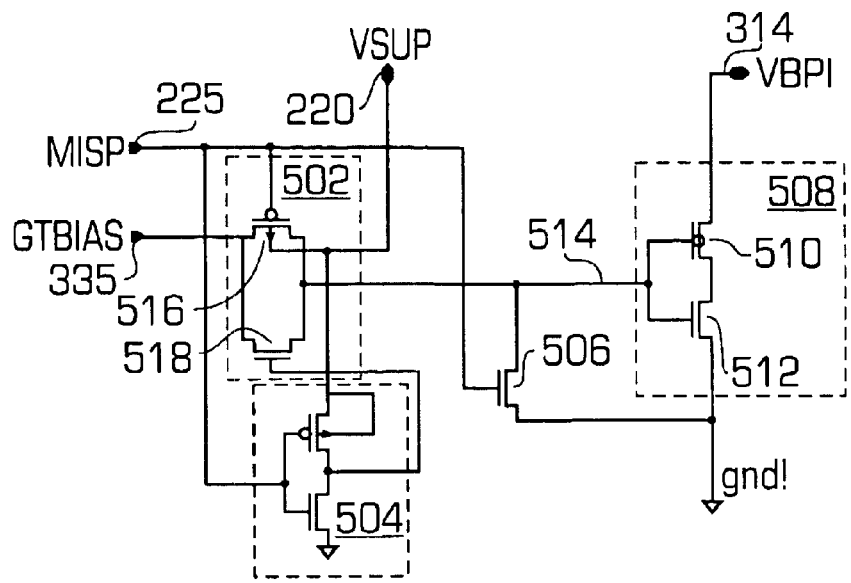
FIG. 5 is a schematic diagram illustrating a trim current circuit of the local bias current circuit of FIG. 3.

FIG. 5 is a schematic diagram illustrating the trim current circuit 308. The trim current circuit 308 comprises a transfer gate 502, a trim command inverter 504, a ground control NMOS transistor 506, and a current cascode 508. The current cascode 508 provides the trim or adjustment of the voltage or bias on the first internal bias voltage (VBPI) line 314 (FIG. 3). The current cascode 508 comprises an NX NMOS transistor 510 and an NH NMOS transistor 512. The NX NMOS transistor 510 includes a drain coupled to the first internal bias voltage line 314 (VBPI), a source coupled to a drain of the NH NMOS transistor 512, and includes a gate coupled to a gate of the NH NMOS transistor 512 to form an input terminal 514 of the current cascode 508. The biasing of the input terminal 514 controls the voltage on the first internal bias voltage (VBPI) line 314. The biasing of the input terminal 514 is controlled by the local trim signal (MISP) 225 and the gate bias voltage (GTBIAS) line 335. The NMOS transistor 506 includes drain-source terminals coupled between the input terminal 514 and ground, and a gate coupled to the first internal bias voltage (VBPI) line 314. In response to a high level of the local trim signal (MISP) 225, the NMOS transistor 506 grounds the input terminal 514.

The transfer gate 502 controls the application of the gate bias voltage (GTBIAS) line 335 to the input terminal 514 of the current cascode 508. The transfer gate 502 comprises a PMOS transistor 516 and an NMOS transistor 518. The PMOS transistor 516 includes a drain coupled to a common node formed of a drain of the NMOS transistor 518 and the gate bias voltage (GTBIAS) line 335. The PMOS transistor 516 includes a source coupled to a common node formed of a source of the NMOS transistor 518 and the input terminal 514. The gate of the PMOS transistor 516 is coupled to the local trim signal (MISP) 225. The gate of the NMOS transistor 518 is coupled to an inverted signal from the inverter 502, which inverts the local trim signal (MISP) 225. A low level of the local trim signal (MISP) 225 enables the transfer gate 502 to apply the gate bias voltage (GTBIAS) line 335 to the input terminal 514 of the current cascode 508 to provide current bias to the first internal (VBPI) line 314.

Figure 6:
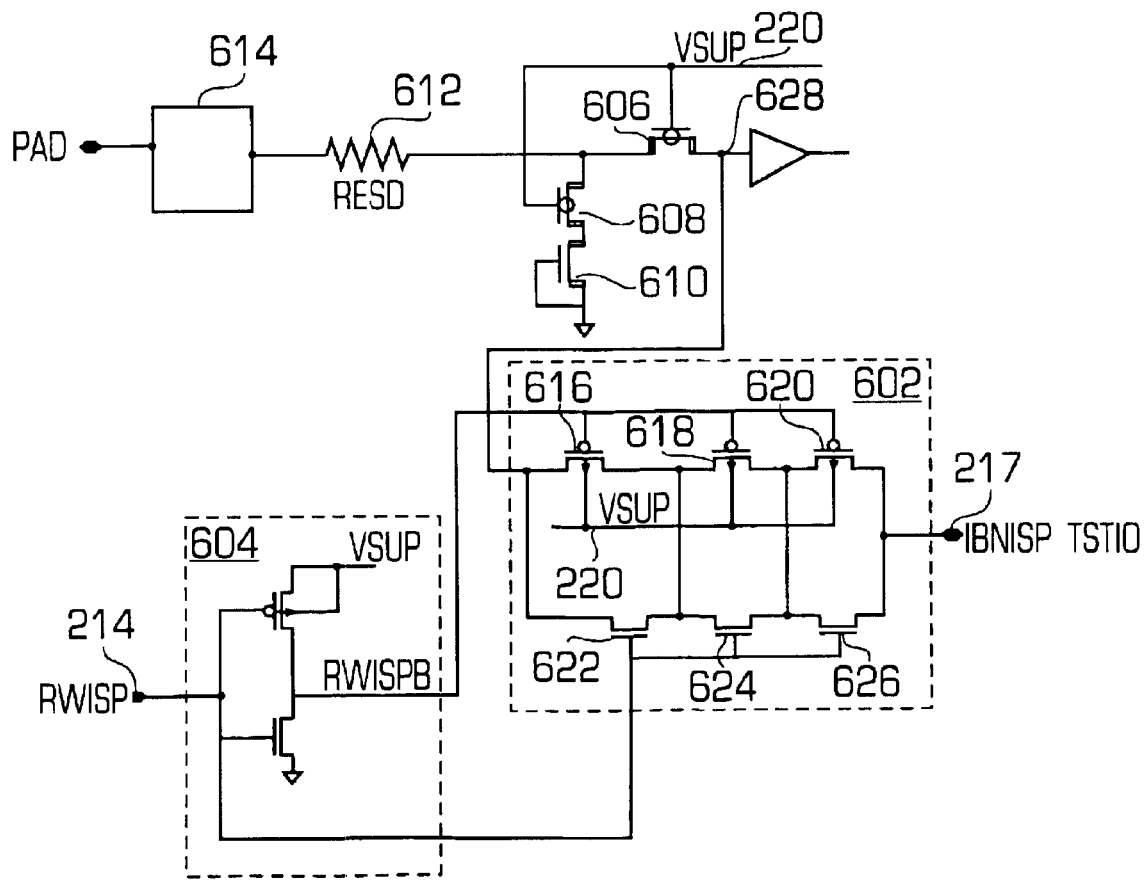
FIG. 6 is a schematic diagram illustrating a low voltage transceiver of the multilevel flash memory system of FIG. 2.

FIG. 6 is a schematic diagram illustrating a low voltage transceiver 600 in accordance with the present invention. The low voltage transceiver 600 provides an isolation circuit for allowing testing of the distributed current network 201 and protecting against electrostatic discharge and noise injected at a pad. The low voltage transceiver 600 comprises a transfer gate 602, an inverter 604, a NX NMOS transistor 606, an NX NMOS transistor 608, an NH NMOS transistor 610, a resistor 612, and a pad 614.

The transfer gate 602 provides a direct path between the test point 471 and a node 628 in response to the read/write bias current control (RWISP) signal 214. The transfer gate 602 comprises PMOS transistors 616, 618, 620 and NH NMOS transistors 622, 624, 626. The NH NMOS transistors 622, 624, 626 include drain-source terminals coupled in series between the node 628 and the test point 471, which receives the I/O bias current (IBNISP_TSTIO) 217, and also include gates coupled together and to the read/write bias current control (RWISP) signal 214. The PMOS transistors 616, 618, 620 include drain-source terminals coupled in series between the node 628 and the test point 471, and also include gates coupled together and to an inverted signal that is an inversion of the read/write bias current control (RWISP) signal 214 and generated by the inverter 604. The bulks of the PMOS transistors 616, 618, 620 are coupled to the supply voltage (VSUP) 220.

By connecting several NMOS transistors in series (e.g., the NMOS transistors 622, 624, 626), disturbance of the internal node 628 by the voltage swing on the pad 614 is avoided as follows. As the pad 614 swings negative, a parasitic bipolar npn, which consists of n+source/drain junctions with p-sub as the base, is forwarded biased which causes the npn to turn on. If only one NMOS transistor is used in the transceiver 600, this disturbs the internal node 628. By including several series NMOS transistors, which effectively have several parasitic npn in series, it basically avoids turning on the whole chain of npn, hence no disturbance occurs on the node 628. For a positive swing, the operation of PMOS transistors in series (e.g., PMOS transistors 616, 618, 620) operates in a similar manner.

The NX NMOS transistor 606 isolates electrostatic discharge on the pad 614 from the test structure. The NX NMOS transistor 606 includes drain-source terminals coupled between the node 628 and a first terminal of the resistor 612. The gate of the NX NMOS transistor 606 is biased by the supply voltage (VSUP) 220. A second terminal of the resistor 612 is coupled to the pad 614.

The NX NMOS transistor 608 and the NH NMOS transistor 610 provide secondary electrostatic discharge protection. The NX NMOS transistor 608 and the NH NMOS transistor 610 include drain-source terminals coupled in series between the common node formed of the drain of the NMOS transistor 606 and the first terminal of the resistor 612, and ground. The gate of the NMOS transistor 608 is biased by the supply voltage (VSUP) 220. The gate of the NH NMOS transistor 610 is coupled to the common node formed of the source of the NMOS transistor 610 and ground.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A memory device comprising:
   an array of memory cells arranged in rows and columns, a portion of said memory cells being divided into segments;
   a global bias circuit generating a plurality of first bias currents; and
   a plurality of local bias networks, each local bias network comprising:
      a local bias circuit generating a plurality of second bias currents in response to a corresponding one of the plurality of first bias currents, and
      a plurality of segment bias circuits generating a third bias current, each segment bias circuit being adjacent to a corresponding segment of said memory cells.

2. The memory device of claim 1 wherein each segment bias circuit provides a ground feedback signal to said local bias circuit, and said local bias circuit adjusts said second bias current in response to said ground feedback signal.

3. The memory device of claim 2 wherein the local bias circuit and the segment bias circuits each comprise transistors and the ground feedback signal provides a relative bias voltage between said transistors.

4. The memory device of claim 3 wherein said relative bias voltage is a voltage across a gate and a source of said transistors.

5. The memory device of claim 1 wherein each segment bias circuit includes a feedback ground line coupled to the local bias circuit to provides a ground feedback signal, and said local bias circuit adjusts said second bias current in response to said ground feedback signal.

6. The memory device of claim 5 wherein the feedback ground lines of the segment bias circuits are coupled to each other.

7. The memory device of claim 5 wherein the feedback ground lines of the segment bias circuits are coupled to a main ground line.

8. The memory device of claim 1, wherein the segment bias circuits are disposed in geometric positions in the segments.

9. The memory device of claim 8 wherein the geometric position is approximately one-fourth of the distance of the segments and relative to an end of the segment having the highest voltage drop.

10. The memory device of claim 8 wherein the geometric position divides the bias voltage difference in the segment approximately equally.

11. The memory device of claim 1, wherein each of the segment bias circuits is disposed adjacent one of said memory cells in a segment to divide said segment into two portions having an equal voltage drop from said segment bias current to a corresponding end of said segment.

12. The memory device of claim 1 wherein the global bias circuit includes a global trim circuit to adjust the plurality of first bias currents in response to a global trim signal.

13. The memory device of claim 12 wherein each local bias network comprises a local trim circuit to adjust the plurality of second bias currents in response to a local trim signal.

14. The memory device of claim 1 wherein each local bias network comprises a local trim circuit to adjust the plurality of second bias currents in response to a local trim signal.

15. The memory device of claim 1 wherein the local bias circuit comprises an output circuit to switch on and off the second bias current and a clock circuit to provide overlapping clocks to the output circuit to form a break before make connection to the plurality of segment bias circuits.

16. The memory device of claim 1 wherein the local bias circuit comprises a bias generator comprising an n-type channel bias structure for providing said second bias current.

17. The memory device of claim 16 wherein the n-type channel bias structure comprises a native type transistor and an enhancement type transistor coupled in a self cascoding arrangement.

18. Th memory device of claim 17 wherein a drain of the native type transistor is arranged as a terminal that provides the second bias current.

19. The memory device of claim 17 wherein a bulk of the native type transistor and the enhancement type transistor is coupled to ground, and the drain of the enhancement type transistor is coupled to a ground feedback line.

20. The memory device of claim 17 wherein a bulk of the native type transistor and the enhancement a transistor is coupled to a ground feedback line, and the drain of the enhancement type transistor is coupled to the ground feedback line.

21. The memory device of claim 1 wherein the local bias circuit comprises an interface coupled to a test point for providing a read current or receiving a write current.

22. A method for biasing an array of memory cells arranged in rows and columns, the method comprising:
dividing a portion of the rows of memory cells into segments;
generating a plurality of global bias currents;
generating a plurality of local bias currents in response to a corresponding one of the plurality of global bias currents; and
generating a plurality of segment bias currents for application to a corresponding one of the segments in response to a corresponding one of the plurality of local bias currents, each segment bias current being generated adjacent to a corresponding segment of said memory cells.

23. The method of claim 22 further comprising:
adjusting ones of said plurality of local bias currents in response to a ground feedback signal from corresponding ones the segments of memory cells.

24. The method of claim 23 further comprising coupling the feedback ground signal from each segment to each other.

25. The method of claim 23 further comprising coupling the feedback ground signal of the segments to a main ground line.

26. The method of claim 22, further comprising applying the segment bias currents to segments in geometric positions in the segments.

27. The method of claim 26 wherein the geometric position is approximately one-fourth of the distance of the a segments and relative to an end of the segment having the highest voltage drop.

28. The method of claim 26 wherein the geometric position divides the bias voltage difference in the segment approximately equally.

29. The method of claim 22, wherein applying each of the segment bias currents to a corresponding segment of said memory cells to divide said segment into two portions having an equal voltage drop from a location of said application of said segment bias current to a corresponding end of said segment.

30. The method of claim 22 further comprising applying a read current to or receiving a write current from a test point to test the plurality of local bias currents.

31. A distributed current network comprising:
a global bias network generating a plurality of local bias drive currents; and
a plurality of local bias networks coupled to the global bias network, each local bias network generating a segment bias current in response to a corresponding one of the plurality of local bias drive currents.

32. The distributed current network of claim 31 wherein the local bias network comprises:
a local bias current generating a segment bias voltage in response to said corresponding one of the plurality of local bias drive currents; and
a plurality of segment biasing currents, each segment biasing current generating a segment bias current in response to said local bias drive current.

33. The distributed current network of claim 32 wherein the plurality of segment biasing circuits includes a ground feedback line coupled to the local bias current circuit and the local bias current circuit further adjusts the local bias drive current based on feedback currents on the ground feedback line.

34. A memory device comprising:
an array of memory cells arranged in rows and columns;
a first bias circuit generating a bias current; and
a second bias circuit comprising a plurality of bias current sources, each bias current source coupled to a corresponding memory cell and mirroring said bias current.

35. The memory device of claim 34 wherein the first bias circuit includes a current source and a first bias transistor and each bias current source includes a second bias transistor coupled to a corresponding memory cell and is coupled to the first bias transistor to mirror said bias current.

36. The memory device of claim 34 wherein the memory cells are hot electron injection memory cells.

37. Them device of claim 34 wherein the memory cells are split gate memory cells.

* * * * *